(12) United States Patent
Lee

(10) Patent No.: US 6,836,445 B2
(45) Date of Patent: Dec. 28, 2004

(54) MEMORY DEVICE IN SEMICONDUCTOR FOR ENHANCING ABILITY OF TEST

(75) Inventor: Byung-Jae Lee, Kyoungki-Do (KR)

(73) Assignee: Hynix Semiconductor Inc., Kyungki-Do (KR)

(*) Notice: Subject to any disclaimer, the term of this patent is extended or adjusted under 35 U.S.C. 154(b) by 17 days.

(21) Appl. No.: 10/618,425

(22) Filed: Jul. 11, 2003

(65) Prior Publication Data
US 2004/0085836 A1 May 6, 2004

(30) Foreign Application Priority Data
Oct. 31, 2002 (KR) .................................. 10-2002-0066919

(51) Int. Cl.[7] .................................................. G11C 8/00
(52) U.S. Cl. ............... 365/230.03; 365/201; 365/230.06
(58) Field of Search ......................... 365/230.03, 201, 365/230.06, 230.08, 189.05, 241

(56) References Cited

U.S. PATENT DOCUMENTS

| | | | | |
|---|---|---|---|---|
| 5,864,510 A | * | 1/1999 | Nakaoka | 365/201 |
| 5,892,721 A | * | 4/1999 | Kim | 365/201 |
| 6,144,598 A | * | 11/2000 | Cooper et al. | 365/201 |
| 6,301,171 B2 | | 10/2001 | Kim | |

FOREIGN PATENT DOCUMENTS

| | | |
|---|---|---|
| JP | 03-049092 | 3/1991 |
| JP | 2000-040397 | 2/2000 |
| JP | 2001-143497 | 5/2001 |
| JP | 2001-202798 | 7/2001 |
| JP | 2001-243799 | 9/2001 |

* cited by examiner

Primary Examiner—Anh Phung
Assistant Examiner—Dang T Nguyen
(74) Attorney, Agent, or Firm—Marshall, Gerstein & Borun LLP

(57) ABSTRACT

A memory device which includes at least one bank having first and second unit blocks, each containing a plurality of cell arrays and first and second decoding units for decoding an inputted column address and outputting column selecting signals of the first and second unit blocks includes a column address transmitting unit, a first combining circuit, a second combining circuit, a first and a second output pads.

4 Claims, 13 Drawing Sheets

FIG. 12
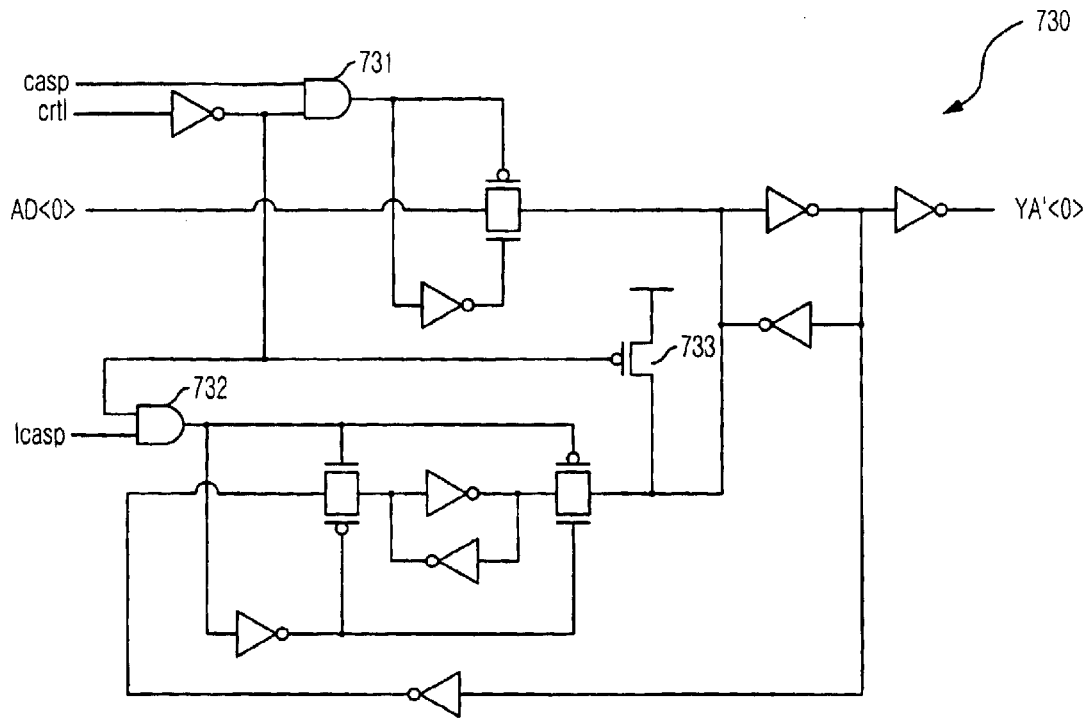
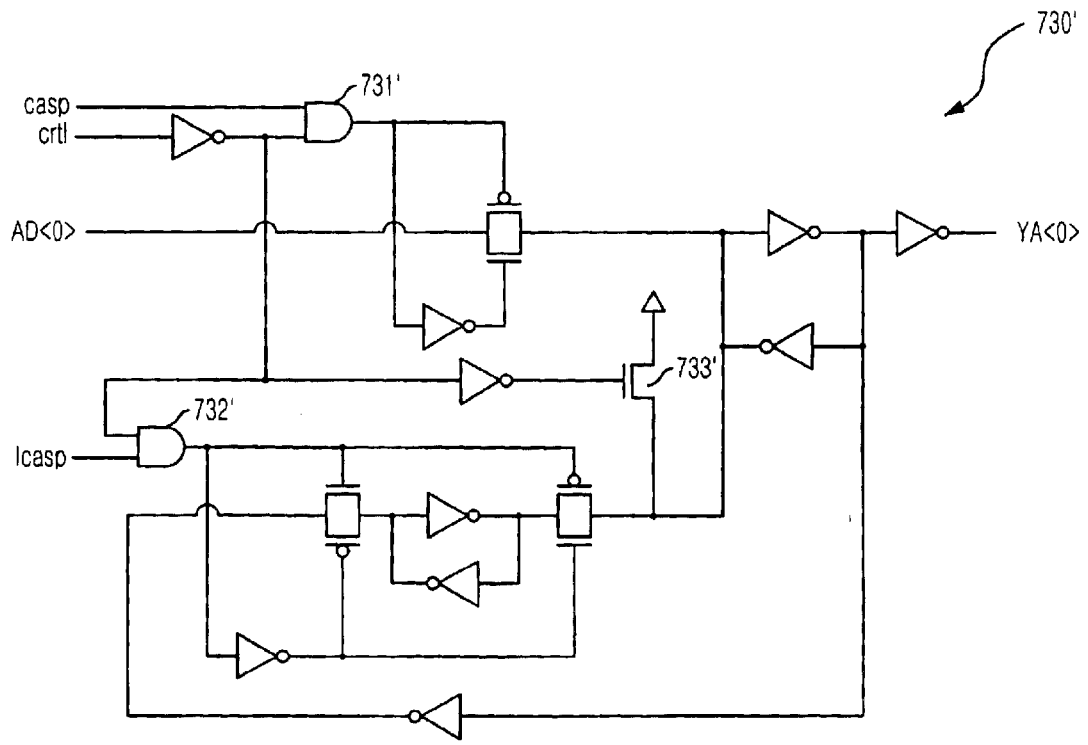

FIG. 13
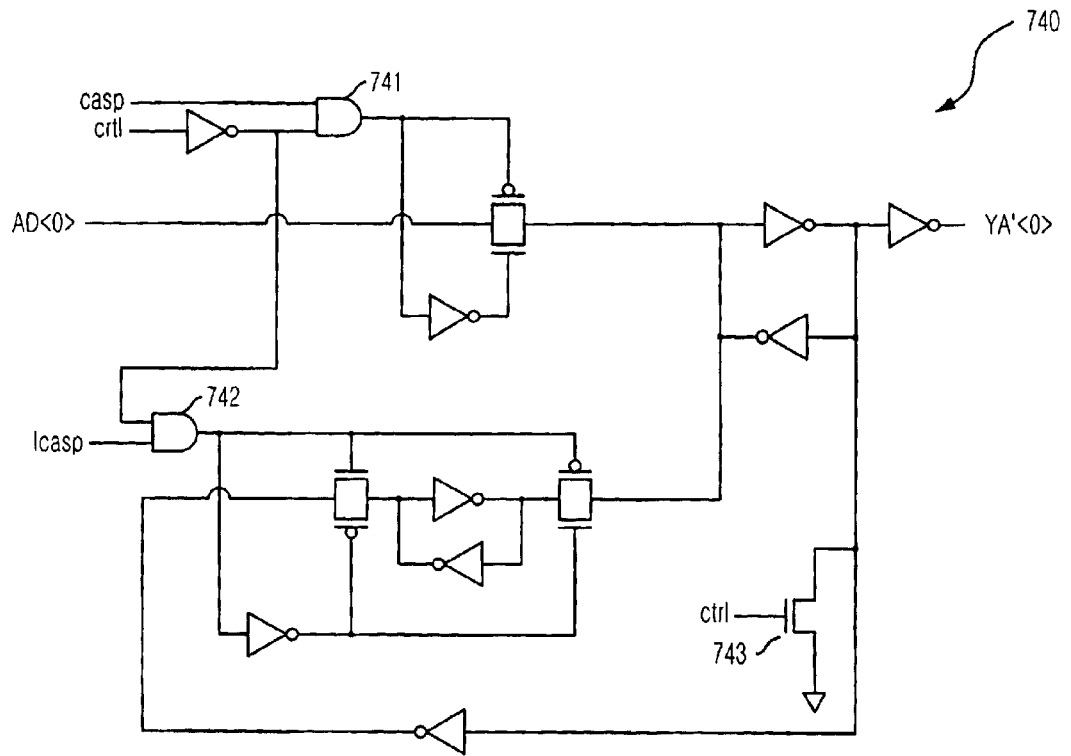
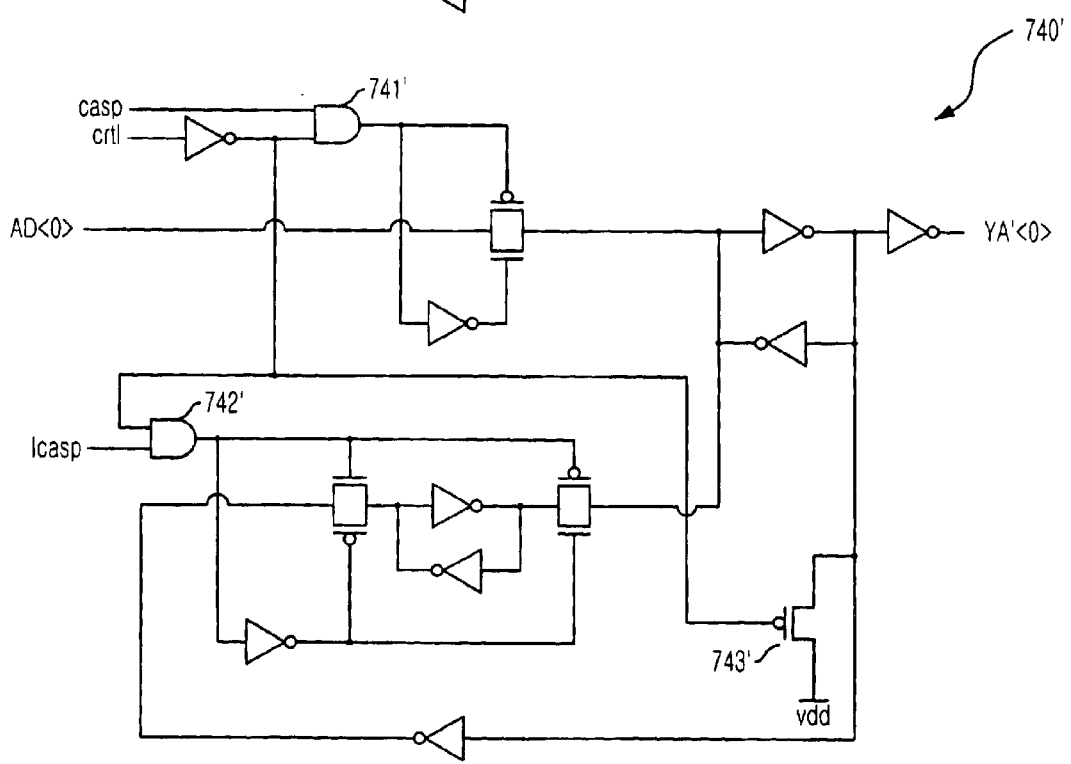

MEMORY DEVICE IN SEMICONDUCTOR FOR ENHANCING ABILITY OF TEST

FIELD OF INVENTION

The present invention relates to a semiconductor memory device; and, more particularly, to a semiconductor memory device having enhance ability of a test for finding fault of a semiconductor memory device.

DESCRIPTION OF PRIOR ART

A semiconductor memory device includes a plurality of memory cells. If any cell in the semiconductor memory device is operated out of order, the semiconductor memory device is useless. After the semiconductor memory device is fabricated, there is needed a test process for finding a defective cell in the semiconductor memory device.

Typically, the semiconductor memory device has an additional area for a test circuit which can test all cells in the semiconductor memory device on high speed. However, according to increasing integration of the semiconductor memory device, there is needed a lot of time and effort for testing cells of the semiconductor memory device so as to research and develop the semiconductor memory device.

FIG. 1 is a block diagram showing a conventional semiconductor memory device.

As shown, the memory device includes four banks 100, 200, 300 and 400. Outputs of the four banks are inputted to a data output buffer 500. The data output buffer 500 outputs a data inputted from the data output buffer 500 into an external circuit through an output pad 500' in response to a clock singal.

One bank, e.g., 100, includes first and second cell blocks 110 and 150, each having a plurality of cell arrays and I/O sense amplifiers 130 and 140 for respectively amplifying data outputted from the first and the second cell blocks 110 and 150 to output the amplified data to the data output buffer 500.

The first cell block 110 has cell arrays 111 to 116 having a plurality of cells and bit line sense amplifiers 117 to 120 for amplifying and outputting data of cells. Also, the structures of the second to the forth banks 200, 300, and 400 are the same to that of the first banks 100, though the second to the forth banks 200, 300, and 400 are not shown in the FIG. 1 in detail for the sake of convenience.

FIG. 2 describes a preferred embodiment of a bit line sense amplifier logic shown in FIG. 1.

As shown, the bit line sense amplifier 117 includes a bit line sense amplifier 117d for sensing and amplifying a gap between voltages of the bit line pair BL and /BL; an equalization logic 117c for precharging and equalizing the voltage of the bit line pair BL and /BL; a first connection logic 117a for connecting the cell array 111 to one side of the bit line sense amplifier; a second connection logic 117b for connecting the cell array 113 to the other side of the bit line sense amplifier; and an output logic 117e for outputting the bit line voltage amplified by the bit line sense amplifier 117d. Herein, RTO and /S are enable signals which can enable or disable the bit line sense amplifier 117d. BISH and BISL are enable signals which can enable or disable the first and the second connection logic 117a and 117b. Vblp is a bit line voltage which will be precharged. BIEQ is an enable signal which can enable or disable the equalization logic 117c. A column selecting signal YI is an enable signal which can enable or disable the output logic 117e.

Hereinafter, referring to FIG. 1 and FIG. 2, the data path in the semiconductor memory device is described in detail.

First, if an address is inputted to the memory device, a word line of a selected cell array in a bank is enabled corresponding to the address. A MOS transistor M1 connected to the enabled word line WL is turned on so that data stored in a capacitor C1 is supplied to a bit line pair BL and /BL. Then, the bit line sense amplifier 117d senses and amplifies the data signal because the data signal stored in the capacitor C1 is too weak.

If the column selecting signal YI is enabled, the data signal sensed and amplified by the bit line sense amplifier 117d is outputted to a data line pair DB and /DB. The data outputted data of the data line pair DB and /DB is amplified one more time by a DB sense amplifier, e.g., block 130 shown in FIG. 1, and, then outputted to the external circuit through the output buffer 500.

The DB sense amplifier should be needed for amplifying the weaken data because the data line pair DB and /DB is relatively long. Also, a number of the DB sense amplifier is determined by a size of data simultaneously outputted by the column selecting signal YI. Typically, there is one DB sense amplifier on the front of one bank.

Referring to FIG. 2 that one bit data is outputted to the data line pair DB and /DB by the column selecting signal YI. However, there is recently needed a memory device which can be operated on high speed. Thus, the memory device is designed so that four-bit data is outputted at once to the DB sense amplifier in response to one column selecting signal YI.

The inputted address may be split into a row address and a column address. The row address enables the word line and the column selecting signal YI is generated from the column address.

FIG. 3 is a block diagram showing a conventional test block for testing a synchronous memory device. As shown, one bank, e.g., the first bank 100, includes the first cell block 110 and the second cell block 150. For operation on high speed, the bank has the first and the second cell blocks 110 and 150, and each cell block has a DB sense amplifier and a decoder.

The test block for testing the memory device includes a Y counter 720 for receiving an address AD<0> to AD<9> from the external circuit and orderly counting it; a first and a second YI decoders 740 and 750 for decoding outputted addresses YA<0> to YA<9> from the Y counter and outputting the column selecting signal YI to each of the first and the second cell blocks 110 and 150; DB sense amplifiers 130 and 140 for amplifying an outputted data signal from the first and the second cell blocks 110 and 150; a test circuit 600 for combining an outputted data signal from the DB sense amplifiers 130 and 140 and performing a test process; and an output buffer 530 for buffering an output signal from the test circuit 600 and outputting it to the external circuit through a pad. Furthermore, the bank has an instruction controller for controlling the Y counter 720 by receiving several instruction signals such as /CS, /CAS, and so on.

FIG. 4 is a timing chart showing a test operation of the test block shown in FIG. 3.

Hereinafter, referring to FIG. 3 to 4, the test operation of the memory device is described in detail.

If the several instruction signals inputted to the instruction controller 710 are correspondent to a test mode, the memory device is operated in the test mode. The Y counter 720 receives column addresses AD<0> to AD<9> and counts the column addresses AD<0> to AD<9> by a burst length BL and, outputs the counted column address YA<0> to YA<9>. The burst length BL is a kind of specifications in the synchronous memory device; and, in detail, means a number of data which is continuously outputted when one address is inputted. For instance, if the burst length is four, the counter 720 counts the received column addresses at four times and, then outputs the counted column address.

The first YI decoder 740 receives the counted addresses YA<0> to YA<9> outputted from the Y counter 720 and outputs a 8-bit test data by selecting the two YI lines YI<a> and YI<b> in YI lines YI<0> to YI<1023>. As shown in FIG. 2, a data signal which is sensed by the bit line sense amplifier is outputted by a YI line. It is assumed that four bit data is outputted if one YI line is selected.

If the memory device is operated in a 0×16 mode, a four-bit data signal is simultaneously outputted by one YI line. If each two YI lines in the first and second cell blocks 110 and 150, i.e., total four YI lines, are selected, a 16-bit data is outputted to external circuit. Herein, it is assumed that the test data is stored in all cells and is directly outputted through the bit line if the YI line is selected by enabling the word line at a predetermined timing.

The second YI decoder 750 also receives the counted addresses YA<0> to YA<9> outputted from the Y counter 720 and outputs a 8-bit test data by selecting the two YI lines YI<c> and YI<d> in the YI lines YI<0> to YI<1023>. The outputted signals from the first and second YI decoders 740 and 750 are simultaneously outputted and, as a result, each YI line included in each cell block 110 and 150 is simultaneously selected.

The 8-bit test data outputted from the first cell block 110 is sensed and amplified by the first DB sense amplifier 130, and each bit of the 8-bit test data is inputted to each of a first to a forth NOR gates 601 to 604 in the test circuit 600. The 8-bit test data outputted from the second cell block 150 is also sensed and amplified by the second DB sense amplifier 140 and individually inputted to each of the first to the forth NOR gates 601 to 604 in the test circuit 600.

Herein, there is a pattern of the test data group. Each data outputted from a group of the DB sense amplifier is exactly same and each group includes four DB sense amplifiers: for example, first group has the $1^{st}$, $5^{th}$, $9^{th}$ and $13^{th}$ DB sense amplifiers; second group has the $2^{nd}$, $6^{th}$, $10^{th}$ and $14^{th}$ DB sense amplifiers; third group has the $3^{rd}$, $7^{th}$, $11^{th}$ and $15^{th}$ DB sense amplifiers; and fourth group has the $4^{th}$, $8^{th}$, $12^{th}$ and $16^{th}$ DB sense amplifiers.

If the data being same to the initial stored test data is outputted from the first to the sixteenth DB sense amplifiers, output signals of the first to forth NOR gates 601 to 604 are in logical high and, as a result, outputs of the first and second NAND gates 605 and 606 is in logical low. Thus, output of the last NOR gate 607 is in logical high and a signal passing through the output buffer 530 is outputted in logical high to the output pad 530'.

A signal outputted to the output pad 530' is only one bit signal, but it is considered as a 16 bit data for testing the memory device because it is generated by combining each bit signals in the test circuit 600. If the output pad 530' outputs a signal in logical low, there is needed a detailed examination about related cells in the memory device.

As shown in FIG. 4, in a test read mode, each 8 bit signal is outputted to the test circuit 600 by each output signal of the first and the second YI decoders 740 and 750. Then, the test of the output signal which is supplied to the output pad 530' can be considered as examination of 16 cells in memory device. The test process is independently performed at each bank because each bank has one output pad.

In one clock time, 16 cells can be tested by the above manner. So, in the memory device which includes several banks having 4 k cells, it takes 256 clock times to test the total cells of the memory device. Today, typical memory device, e.g., a 512 Mb memory, includes four banks and each bank has 128 Mb cells. Thus, there is needed 8 Mb clock times for testing the total cells in the memory device. There is needed a test block for testing total cells of the memory device faster because the 8 Mb clock times are relatively long time.

FIG. 5 is a schematic circuit diagram showing a part of a Y counter shown in FIG. 3.

The Y counter can includes a plurality of the partial circuits shown in FIG. 5 in response to several inputted addresses. If an address AD<0> is inputted to the Y counter, the Y counter outputs a YA<0> through 'A' path shown in FIG. 5. In a next time, the Y counter outputs the YA<0> through 'B' path after latching the address AD<0>. This operation is controlled by control signals casp and Icasp which are outputted from an instruction controller 710.

For operating a memory device on higher speed, there is developed a double data rate memory device (hereinafter, referred as DDR memory device) which can output a data signal at both a rising and a falling edges of the clock. Furthermore, there has been developed a combo memory device which can be operated like either a single synchronous memory device of the prior art or a DDR memory device according to system circumstance.

FIG. 6 is a block diagram showing another convention of test block for testing a synchronous combo type memory device.

As shown, structure of the test block is similar to that of the test block shown in FIG. 3. However, there are two test circuits 600 and 600' and each of a first and a second cell blocks 110' and 150' has 16 DB sense amplifiers. The test block further includes a path selecting circuit 620 for selectively outputting a data outputted from the test circuits 600 and 600' to an output buffer 530.

FIG. 7 is a timing chart showing a test operation of the test block shown in FIG. 6 when the synchronous combo type memory device operates in a single mode. The single mode means an operation mode that a data is outputted at a rising edge of a clock signal like a conventional synchronous memory device.

Hereinafter, referring to FIGS. 6 and 7, there is a method for testing the test block in detail when the combo type memory device is operated in the single mode.

Operation of the test block is similar to that of the test block shown in FIG. 3. The first YI decoder 740 receives and decodes address signals YA<0> to YA<9> outputted from the Y counter 720 and, then selects a YI line. The memory device includes 16 DB sense amplifiers in each cell block 110' and 150'. So, a 16-bit test data is outputted at once to the first test circuit 600 through the DB sense amplifiers by selecting four YI lines.

In addition, the second YI decoder 750 receives and decodes address signals YA<0> to YA<9> outputted from the Y counter 720 and, then selects a YI line. The memory device includes 16 DB sense amplifiers in each cell block 110' and 150'. So, a 16-bit test data is outputted at once to the second test circuit 600' through the DB sense amplifiers by selecting four YI lines.

Herein, like the above statement, each data outputted from a group of the DB sense amplifier is exactly same and each group includes four DB sense amplifiers: first group has the $1^{st}$, $5^{th}$, $9^{th}$ and $13^{th}$ DB sense amplifiers; second group has the $2^{nd}$, $6^{th}$, $10^{th}$ and $14^{th}$ DB sense amplifiers; third group has the $3^{rd}$, $7^{th}$, $11^{th}$ and $15^{th}$ DB sense amplifiers; and fourth group has the $4^{th}$, $8^{th}$, $12^{th}$ and $16^{th}$ DB sense amplifiers.

It is assumed that the data stored in the total cells of the cell blocks 110' and 150' are initially in logical low. If the data which is initially stored in the memory device are outputted to the $1^{st}$ to the $16^{th}$ DB sense amplifiers, output signals of the first to the forth NOR gates 601 to 604 in the first test circuit 600 are in logical high. However, if there is any defective cell in the memory device, the first to the forth NOR gates 601 to 604 cannot output a logic high signal. If there is not any defective cell, output signals of the first and second NAND gates 605 and 606 are in logical low and an output signal of the final NOR gate 607 is in logical high. The output signal from the first test circuit 600 is outputted to an external circuit after passing through the path selecting circuit 620 and the output buffer 530.

Herein, there is not described operation of the second test circuit 600' because it is the same to that of the first test circuit 600.

Though the output signal of the output pad 530' is just one bit, it can be considered as a result of testing the 16-bit test data. Namely, 16-bit cells are tested at once in one time test by using one the output pad.

In FIG. 7, in a test read mode, each 16-bit signals outputted from the first and the second YI decoders is outputted to the first and the second test circuits 600 and 600'. It is described operation of the test circuit that 16-bit data is combined and outputted to the output pad 530'.

Each bank uses one output pad, so each bank can independently test its cells in the above manner.

The 16-bit cells can be tested at once. Thus, total testing time of testing the whole cells in the memory device is 256 clock times if the memory device has 4 k banks as shown in FIG. 7. Today, in a high integrated memory device having 128 MB banks, 8 Mb clock times are needed for testing the whole cells in the memory device.

FIG. 8 is a timing chart showing a test operation of the test block shown in FIG. 6 when the synchronous combo type memory device operates in a DDR mode.

As shown, there is difference that the four YI lines are selected at every rising and falling edges of the clock signal by the first and the second YI decoders 740 and 750. Thus, during every one clock time, 32-bit cells can be tested.

In the DDR mode of the memory device having 4 K banks, as shown in FIG. 7, 128 clock times are needed for testing the whole cells of the memory device because 32-bit cells are tested at once. Today, in a high integrated memory device having 128 MB banks, 4 Mb clock times are needed for testing the whole cells of the memory device.

However, there is needed a test circuit which can test two times cells at once because data is continuously outputted at every rising and falling edges of the clock signal. If there is not the test circuit, the memory device must be operated in the single mode.

In conclusion, as the memory device is more integrated, test time of the memory device is a critical issue for effectively testing the memory device and reducing manufacturing cost. There is needed a memory device which can test its cells during shorter time.

SUMMARY OF INVENTION

It is, therefore, an object of the present invention to provide a synchronous memory device for reducing testing time.

In accordance with an aspect of the present invention, there is provided the memory device which includes at least one bank having first and second unit blocks, each containing a plurality of cell arrays and first and second decoding units for decoding an inputted column address and outputting column selecting signals of the first and second unit blocks, including a column address transmitting unit for simultaneously enabling the first and second decoding unit, regardless of a bit select block signal, which selects the first or second unit blocks, of the inputted column address during a test mode; a first combining circuit for combining test data outputted by the column selecting signal of the first unit blocks and detecting an error of the test data in the test mode; a second combining circuit for combining test data outputted by the column selecting signal of the second unit blocks and detecting an error of the test data in the test mode; and a first and a second output pads for individually outputting each of outputted signals from the first and second combining circuits.

BRIEF DESCRIPTION OF THE DRAWINGS

The above and other objects and features of the present invention will become apparent from the following description of preferred embodiments taken in conjunction with the accompanying drawings, in which:

FIG. 12 is a schematic circuit diagram showing a Y counter described in FIG. 11; and FIG. 13 is a schematic circuit diagram showing a Y count described in FIG. 11.

DETAILED DESCRIPTION OF INVENTION

Hereinafter, a semiconductor memory device in accordance to the present invention will be described in detail referring to the accompanying drawings.

The semiconductor memory device includes several banks. Each bank includes first and second unit block 110 and 150 having a plurality of cell arrays.

Figure 9:
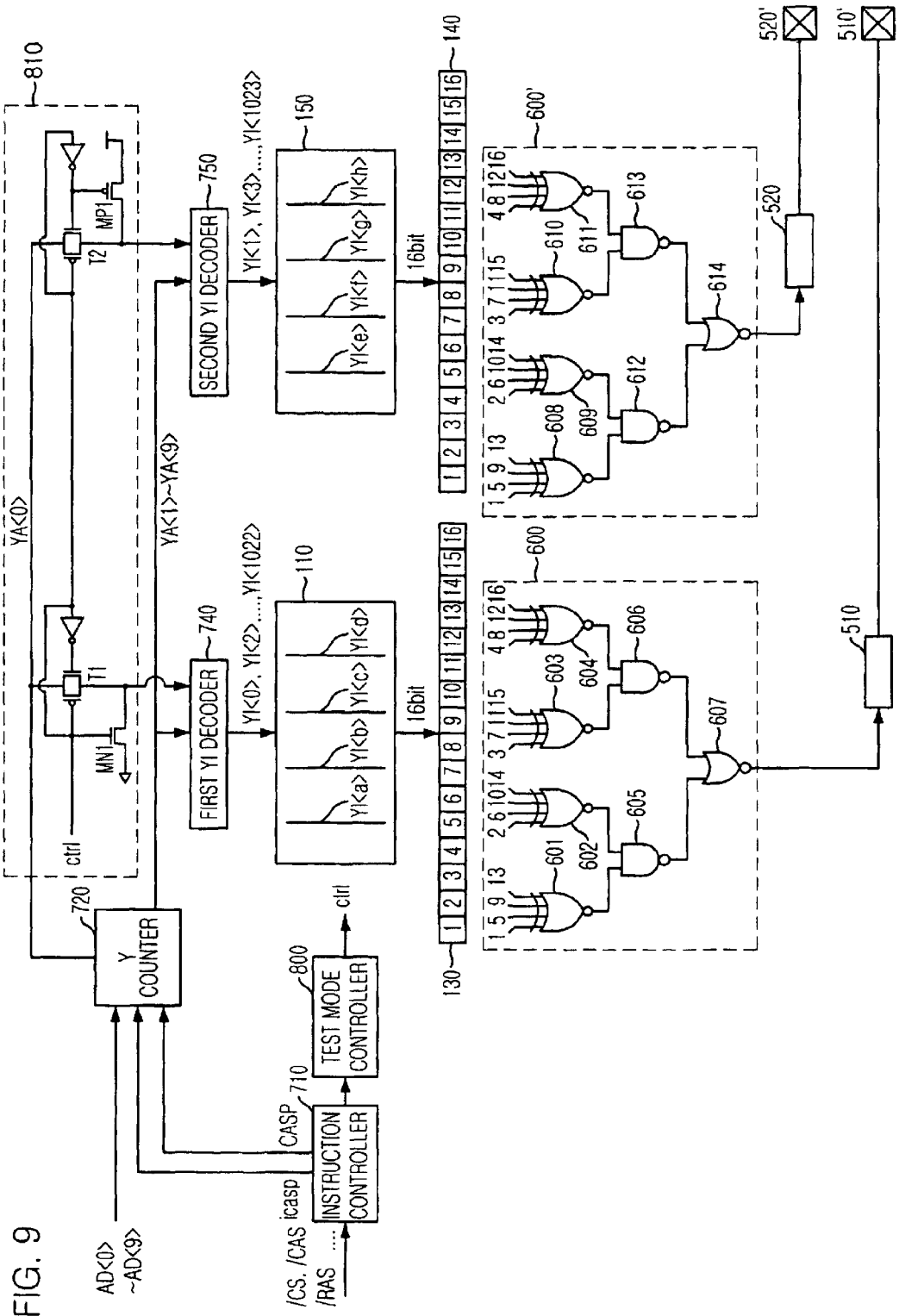
FIG. 9 is a block diagram showing a test block for testing a memory device in accordance with a preferred embodiment of the present invention.

FIG. 9 is a block diagram showing a test block for testing a memory device in accordance with a preferred embodiment of the present invention.

As shown, in the memory device according to a preferred embodiment of the present invention, the bank includes first and second unit blocks 110 and 150, a first and a second decoding units 740 and 750, a column address transmitting unit 810, a first and a second combining circuits 600 and 600', a first and a second DB sense amplifiers 130 and 140, a first and a second output buffers 510 and 520, and a first and a second output pads 520' and 510'.

The first and second unit blocks 110 and 150 have a plurality of cell arrays. The first and second decoding units 740 and 750 decode an inputted column address and, then output column selecting signals, e.g., YI<0> to YI<1024>, of the first and second unit blocks 110 and 150. The column address transmitting unit 810 simultaneously enables the first and second decoding unit 740 and 750 regardless of a block select signal YA<0> of the inputted column address during a test mode. The block select signal YA<0> is used for selecting the first or second unit blocks 110 and 150. The first combining circuit 600 combines test data outputted by the column selecting signal YI<0> to YI<1022> of the first unit blocks 110 so as to detect an error of the test data in the test mode. The second combining circuit 600' combines test data outputted by the column selecting signal YI<1> to YI<1023> of the second unit blocks 150 so as to detect an error of the test data in the test mode. The first and second output pads 520' and 510' individually output each of outputted signals from the first and second combining circuits 600 and 600'.

The first and the second DB sense amplifiers 130 and 140 sense and amplify test data outputted from the first and second unit block 110 and 150. The first and the second output buffers 510 and 520 is used for buffering output signals of the first and second combing circuits 600 and 600' and outputting the output signals to an external circuit through the first and second output pads 520' and 510'.

Furthermore, there is an instruction controller 710 for controlling an operation mode of the memory device after receiving several instruction signals such as /CS, CAS, /RAS, and so on. The memory device also includes a test mode controller 800 for controlling the column address transmitting unit 810 by the instruction controller 710 and a Y counter 720 for receiving the column address AD<0> to AD<9> and outputting a counted address YA<0> to YA<9> which are counted by a burst length BL.

The column address transmitting unit 810 selectively enables the first or second decoding unit 740 or 750 in response to the block select signal YA<0> for selecting the first and second decoding units 740 and 750 in a normal mode.

The first combining circuit 600 includes a first to a forth exclusive NOR gates for receiving test data, a first and a second NAND gates for individually receiving each two output signals of the four NOR gates, and a NOR gate for receiving output signals of the first and second NAND gate. The test data outputted from a group of the DB sense amplifier is exactly same and each group includes four DB sense amplifiers: first group has the $1^{st}$, $5^{th}$, $9^{th}$ and $13^{th}$ DB sense amplifiers; second group has the $2^{nd}$, $6^{th}$, $10^{th}$ and $14^{th}$ DB sense amplifiers; third group has the $3^{rd}$, $7^{th}$, $11^{th}$ and $15^{th}$ DB sense amplifiers; and fourth group has the $4^{th}$, $8^{th}$, $12^{th}$ and $16^{th}$ DB sense amplifiers. Elements of the second combining circuit 600' are the same to those of the first combining circuit 600.

Figure 1:
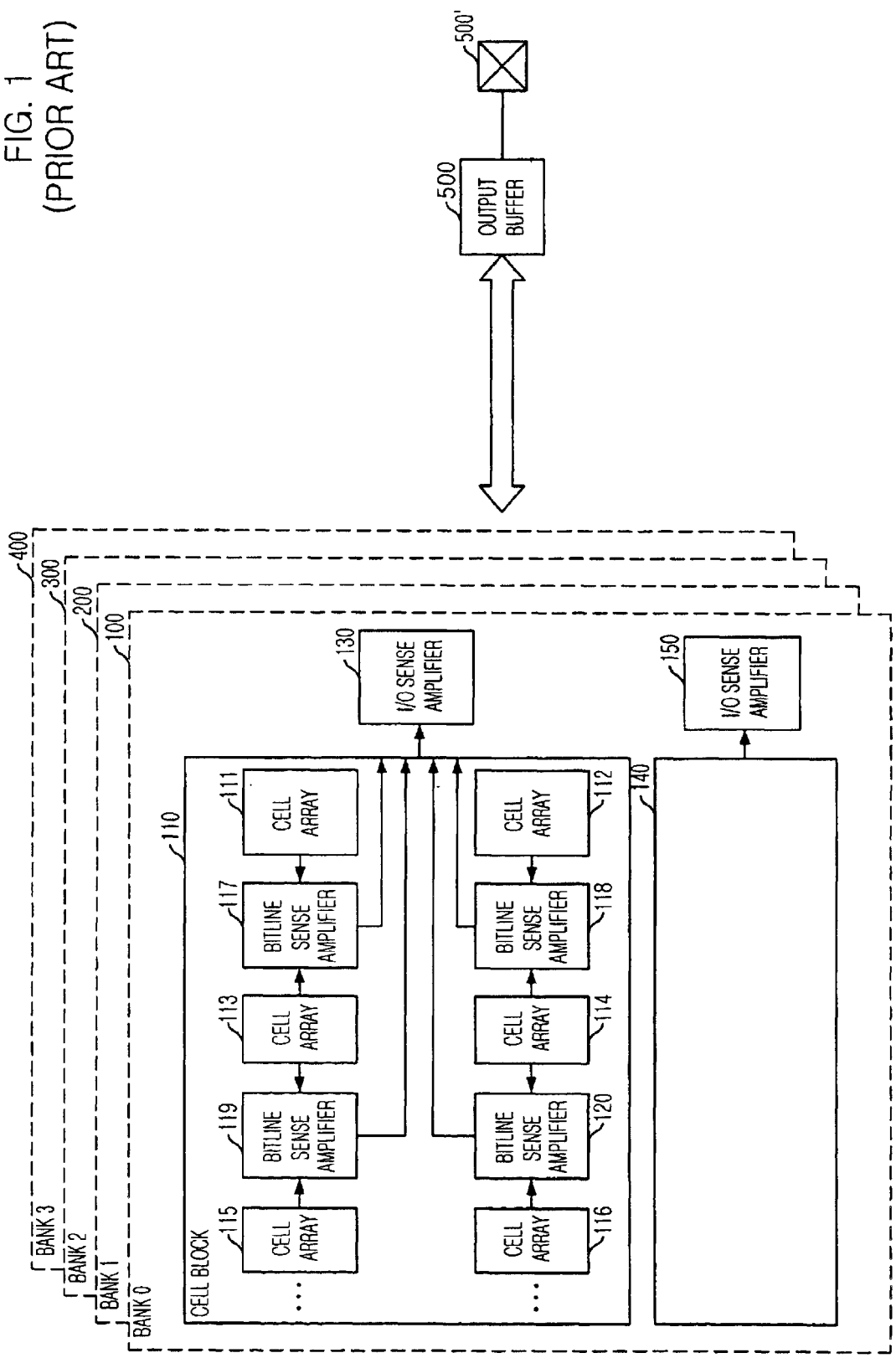
FIG. 1 is a block diagram showing a conventional semiconductor memory device.
Figure 2:
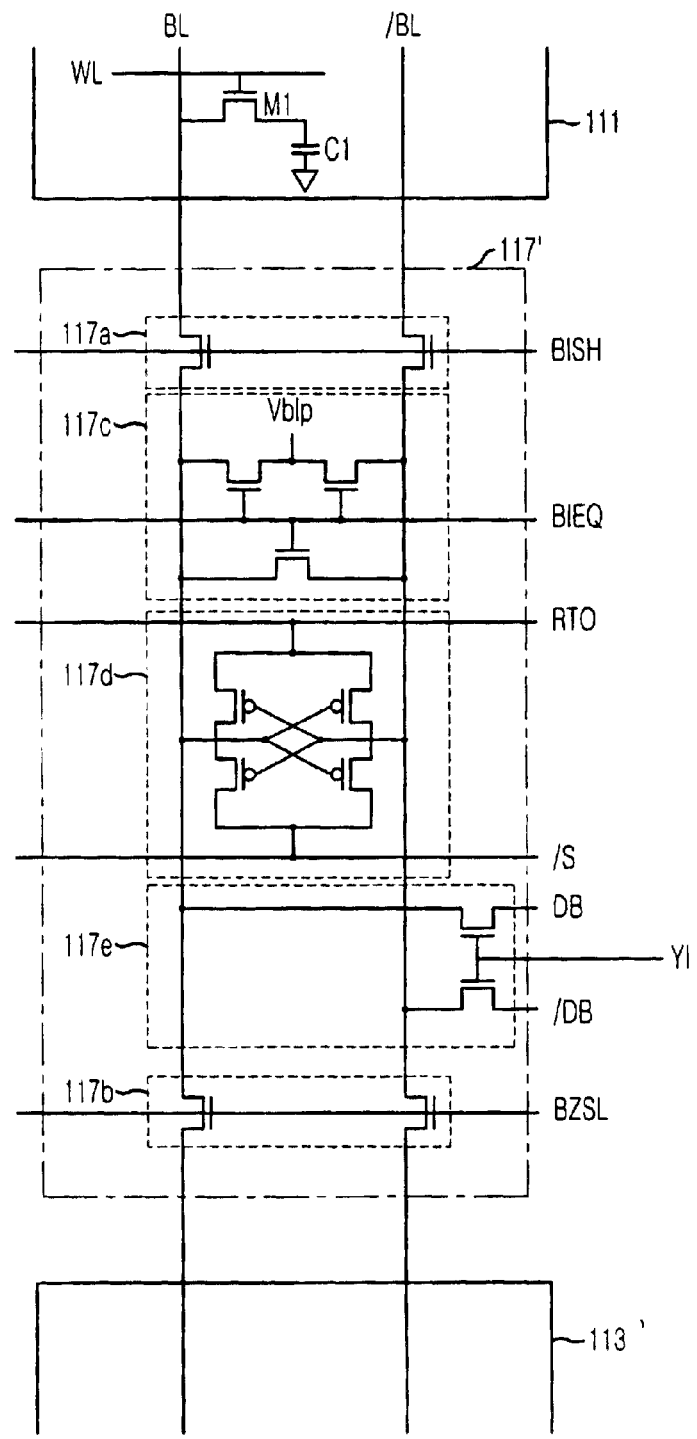
FIG. 2 describes a preferred embodiment of a bit line sense amplifier logic shown in FIG. 1.
Figure 3:
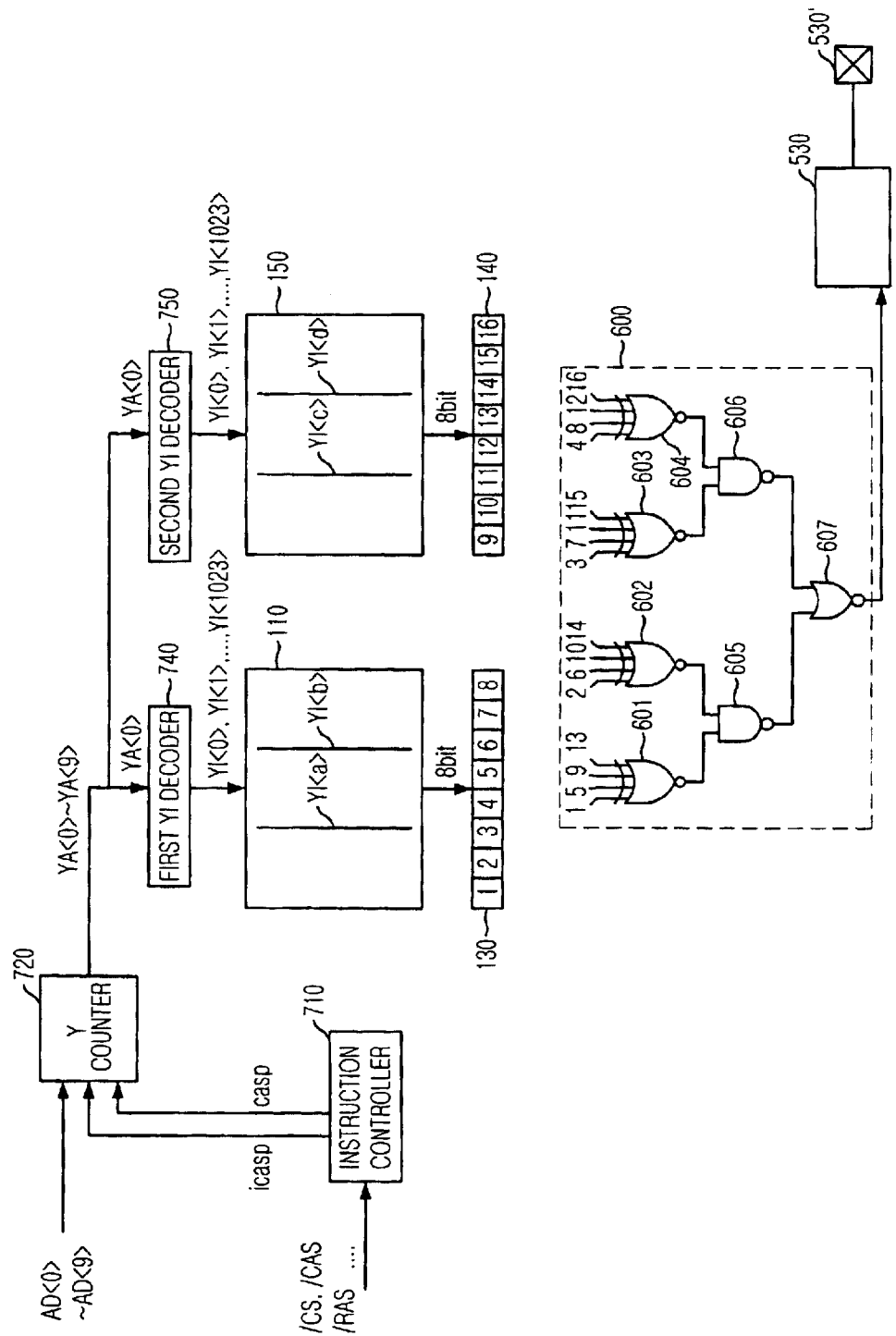
FIG. 3 is a block diagram showing a test block for testing a conventional synchronous memory device.
Figure 4:
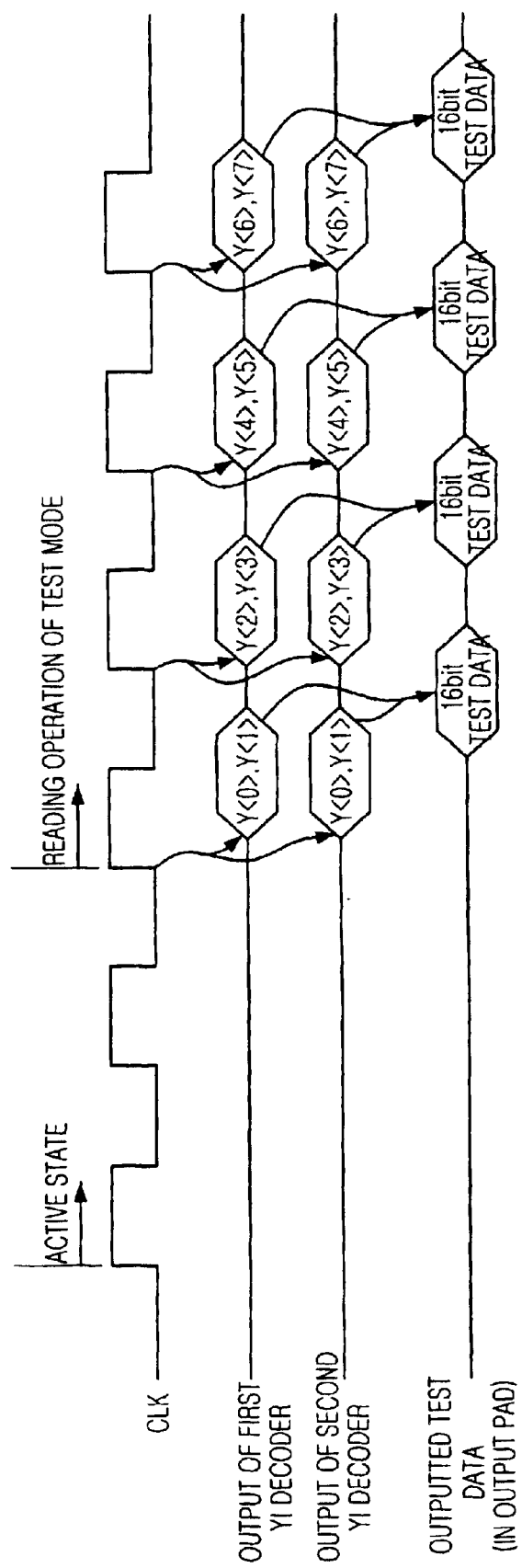
FIG. 4 is a timing chart showing a test operation of the test block shown in FIG. 3.
Figure 5:
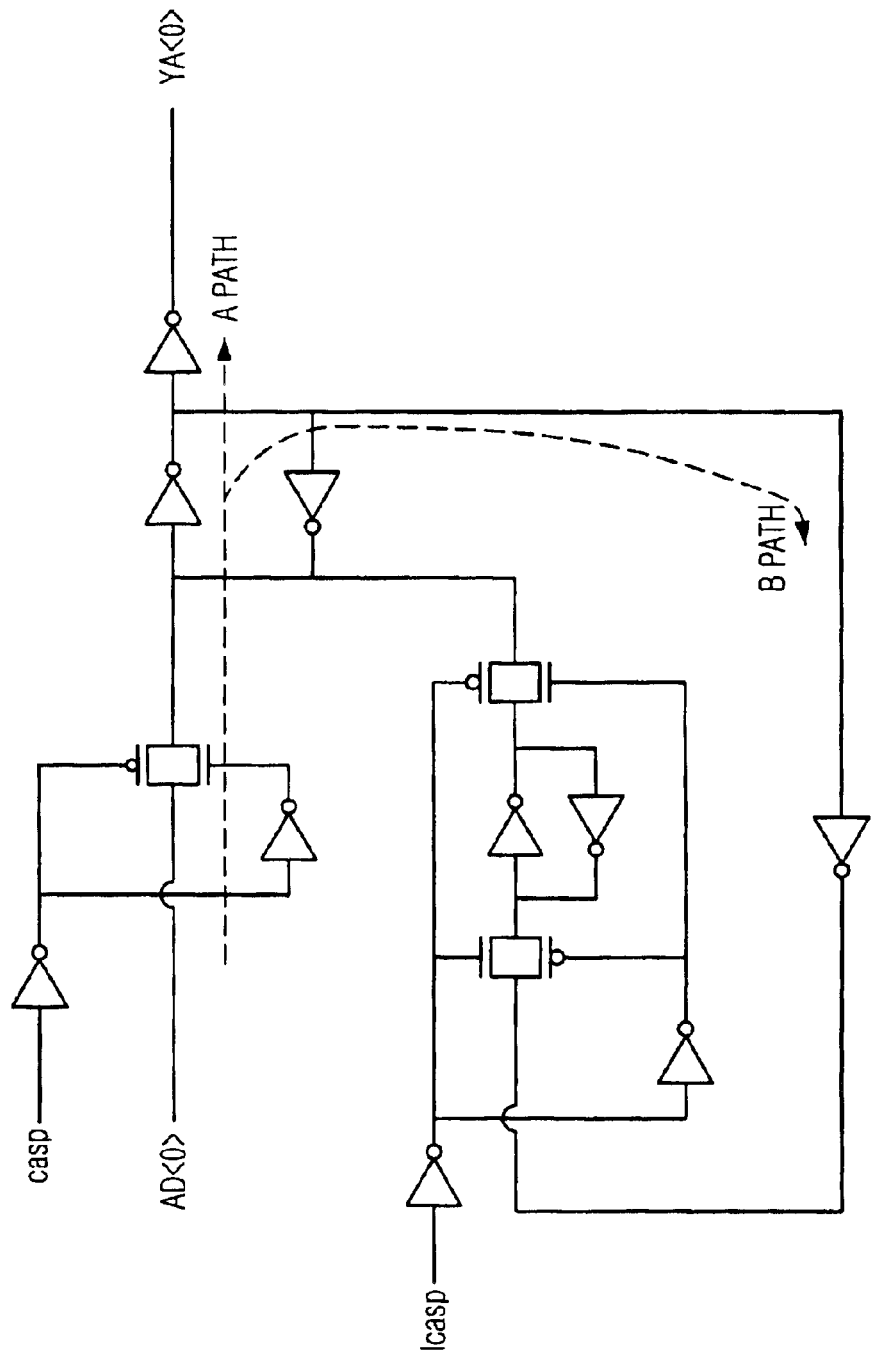
FIG. 5 is a schematic circuit diagram showing a part of a Y counter shown in FIG. 3.
Figure 6:
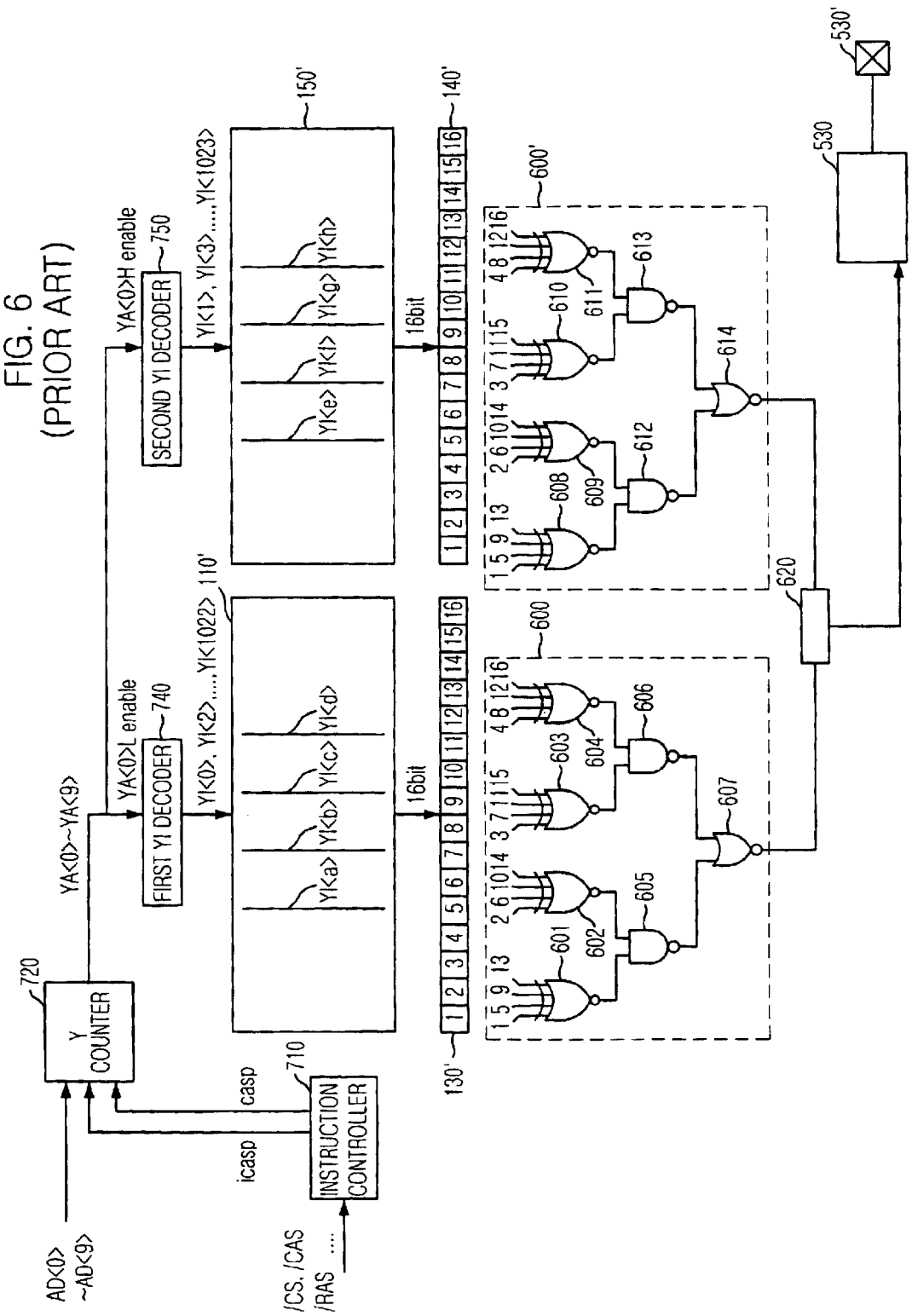
FIG. 6 is a block diagram showing a test block for testing a synchronous combo type memory device in accordance with the prior art.
Figure 7:
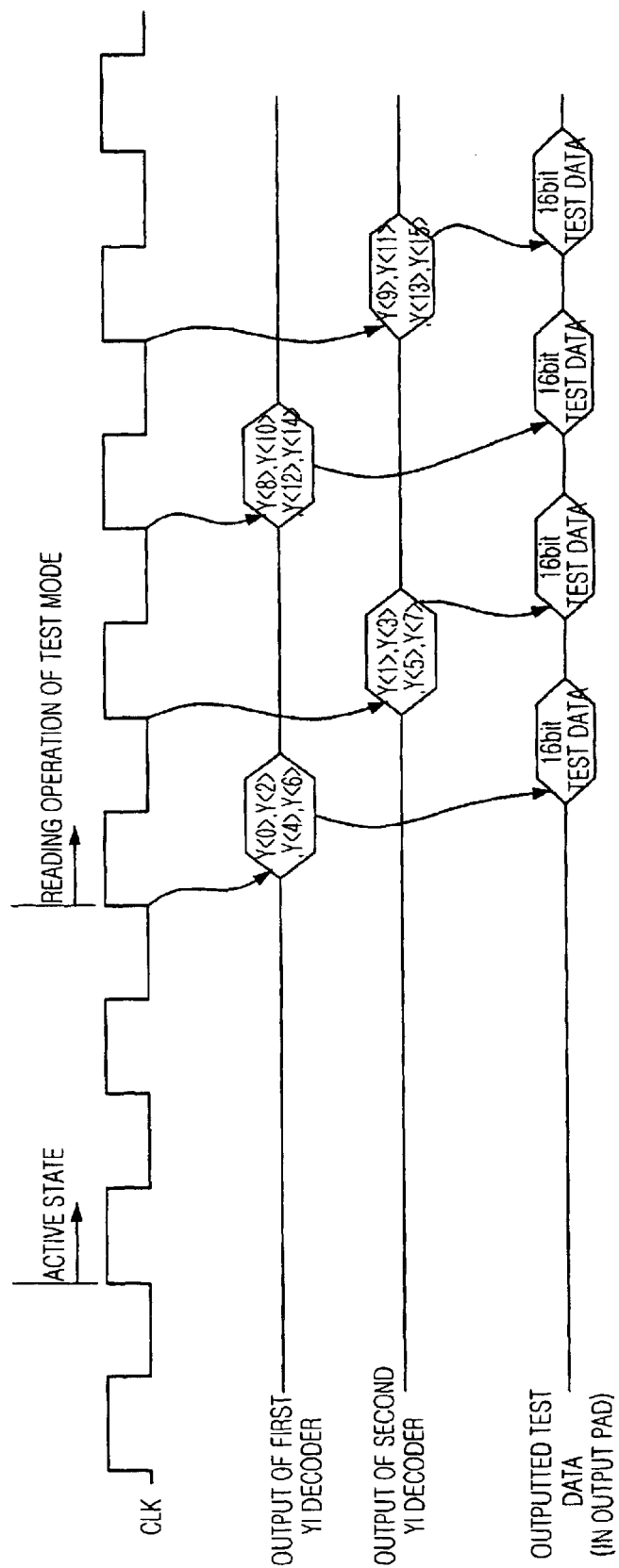
FIG. 7 is a timing chart showing a test operation of the test block shown in FIG. 6 when the synchronous combo type memory device operates in a single mode.
Figure 8:
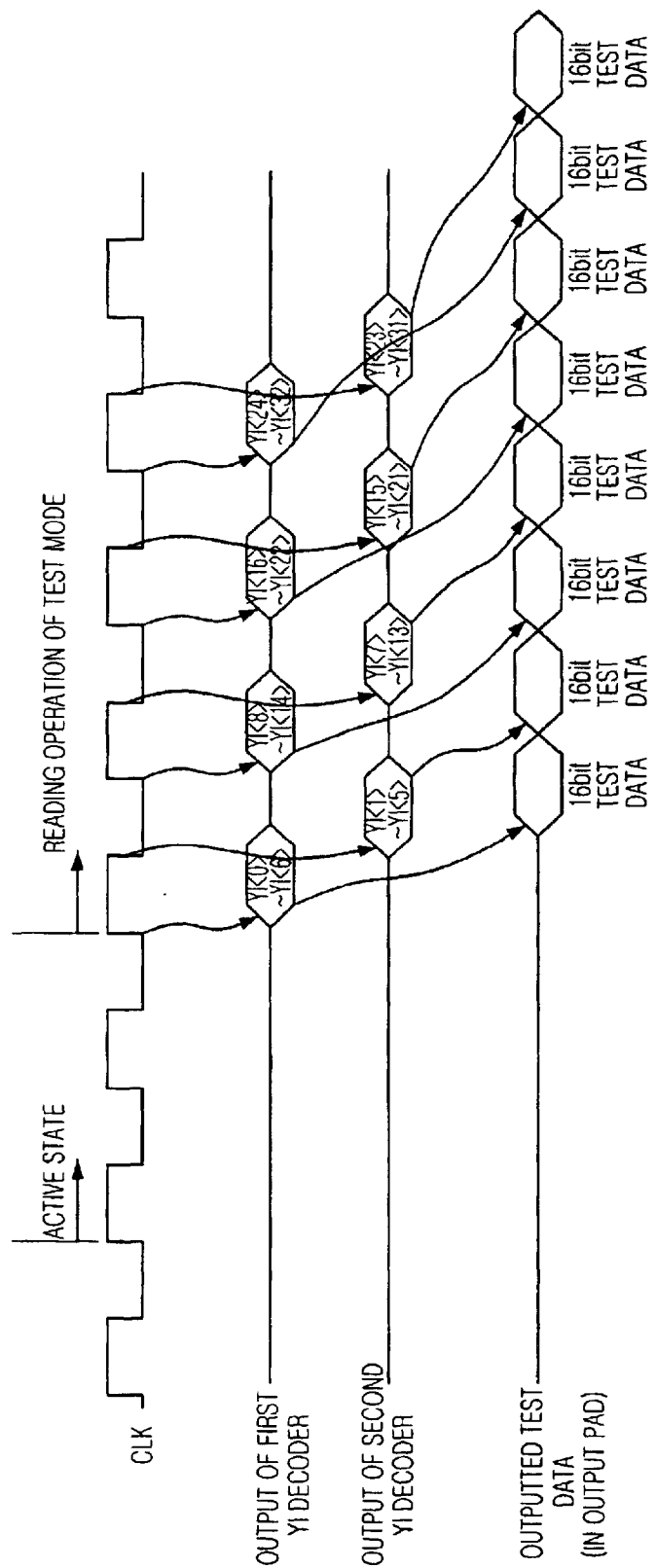
FIG. 8 is a waveform showing a test operation of the test block shown in FIG. 6 when the synchronous combo type memory device operates in a DDR mode.
Figure 10:
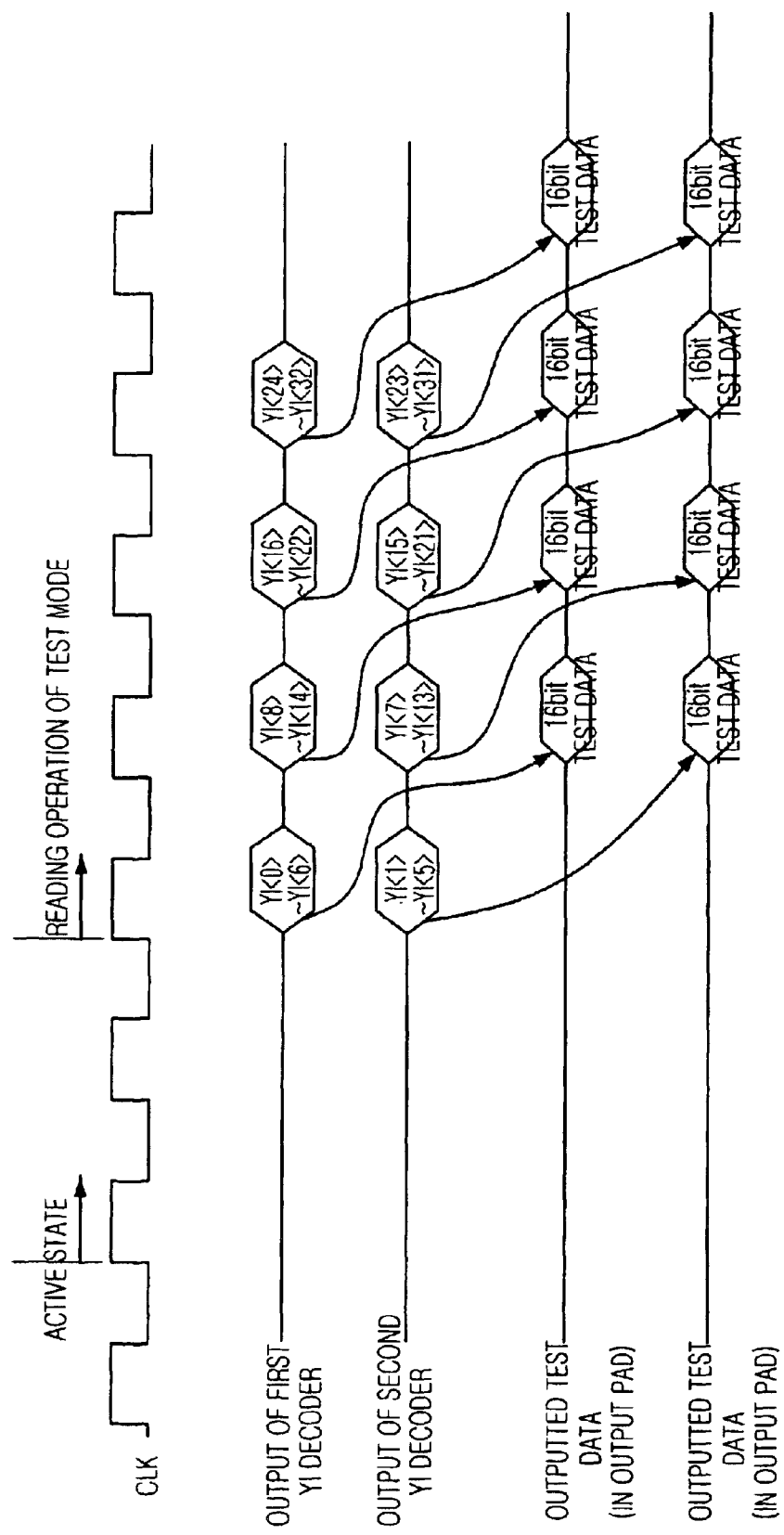
FIG. 10 is a timing chart showing a test operation of the test block shown in FIG. 9.

FIG. 10 is a timing chart showing a test operation of the memory device shown in FIG. 6.

Referring to FIGS. 9 and 10, there is described operation of the memory device in accordance with the present embodiment of the present invention.

If inputted instructions of the instruction controller 710 are correspondent to the test mode, the memory device is operated in the test mode. The Y counter 720 counts the column address AD<0> to AD<9> by the burst length BL.

Herein, the burst length BL is a kind of specifications in the synchronous memory device; and, in detail, means a number of data which is continuously outputted when one address is inputted. For instance, if the burst length is four, the counter 720 counts the received column addresses at four times and, then outputs the counted column address.

In the column address transmitting unit 810, transmission gates T1 and T2 is turned off by a control signal ctrl outputted from the test mode control unit 800 and MOS transistors MP1 and MN1 are turned on. Namely, the first and the second YI decoding units 740 and 750 is always enabled regardless of the block select signal YA<0> for selecting the first and second YI address 740 and 750.

After receiving the counted column address YA<1> to YA<9>, the first and second YI decoding units 740 and 750 select a YI line so that the first and second unit block 110 and 150 can simultaneously output the test data to the first and second DB sense amplifiers 130 and 140.

After simultaneously receiving the counted address YA<1> to YA<9> from the Y counter 720, the first YI decoding unit 740 selects four YI lines YI<a>, YI<b>, YI<c> and YI<d> out of the YI lines YI<0> to YI<1022> so that 16-bit test data are outputted to the DB sense amplifiers 130. It is assumed that the test data is stored in each cell of the memory device and directly outputted through a bit line if a word line is enabled and a YI line is selected at proper timing.

Likewise, after simultaneously receiving the counted address YA<1> to YA<9> from the Y counter 720, the second YI decoding unit 740 selects four YI lines YI<a'>, YI<b'>, YI<c'> and YI<d'> out of the YI lines YI<1> to YI<1023>, so 16-bit test data are outputted to the DB sense amplifiers 140. Namely, in each of the first and second YI decoder 740 and 750, four YI lines are simultaneously selected so that 16-bit test data are individually outputted to each of the first and the second DB sense amplifiers 130 and 140.

The 16-bit test data outputted from the first unit block 110 is sensed and amplified by the DB sense amplifier 130 and individually inputted to the first to forth NOR gates 601 to 604 of the first combining circuit 600. In addition, The 16-bit test data outputted from the second unit block 150 is sensed and amplified by the second DB sense amplifier 140 and individually inputted to the fifth to the eighth NOR gates 608 to 611 of the second combining circuit 600'.

The test data outputted from a group of the DB sense amplifier is exactly same and each group includes four DB sense amplifiers: first group has the $1^{st}$, $5^{th}$, $9^{th}$ and $13^{th}$ DB sense amplifiers; second group has the $2^{nd}$, $6^{th}$, $10^{th}$ and $14^{th}$ DB sense amplifiers; third group has the $3^{rd}$, $7^{th}$, $11^{th}$ and $15^{th}$ DB sense amplifiers; and fourth group has the $4^{th}$, $8^{th}$, $12^{th}$ and $16^{th}$ DB sense amplifiers.

Thus, if the test data are outputted to the first and the second DB sense amplifiers 130 and 140, output signals of the first to the eighth NOR gates 601 to 604 and 608 to 611 are in logical high and, then output signals of the first to the forth NAND gates 605, 606, 612 and 613 are in logical low. Therefore, output signals of the final NOR gates 607 and 614 are in logical high and are outputted to an external circuit after individually passing through each of the output buffers 510 and 520 and each of the output pads pad1 and pad2, e.g., 510' and 520'.

If the output signals of the final NOR gates 607 and 614 are in logical high, there is not any trouble at 32 cells of the memory device in response to the output signals. Namely, each of the first and second combining circuit 600 and 600' can test whether or not 16 cells are well.

As shown in FIG. 10, at the read state of the test mode, each of the first and second YI decoding units 740 and 750 selects each four YI lines, e.g., YI<0>, YI<2>, YI<4> and YI<6>; YI<1>, YI<3>, YI<5> and YI<7>. Then each 16-bit test data is individually outputted from the first and the second unit blocks 110 and 150 through the first and the second DB sense amplifiers 130 and 140.

Each of the first and second combining circuits 600 and 600' combines 16-bit test data to a one-bit signal. The one-bit signal is outputted to an external circuit after passing through each of the output buffers 510 and 520 and each of output pads pad1 and pad2, e.g., 510' and 520'. Thus, 16 cells are able to be tested at once if the one-bit signal is checked.

In a memory device having four banks, if the bank uses two output pads during a test operation, total time for testing total cells in the memory device goes halves. In this case that the memory device has four banks and each bank uses two output pads, eight output pads are used at once.

Like the above method, in the memory device shown in FIG. 9, there are needed 128 clock timings for testing the total cells in 4 Kb bank because 32 cells are tested at once. Today, the memory device typically includes 128 Mb banks. Thus 4 Mb clock timings are needed for testing the total cells in the bank. Thus, though the memory device is not operated in a dual mode, total testing time goes halves if two output pads are used.

Figure 11:
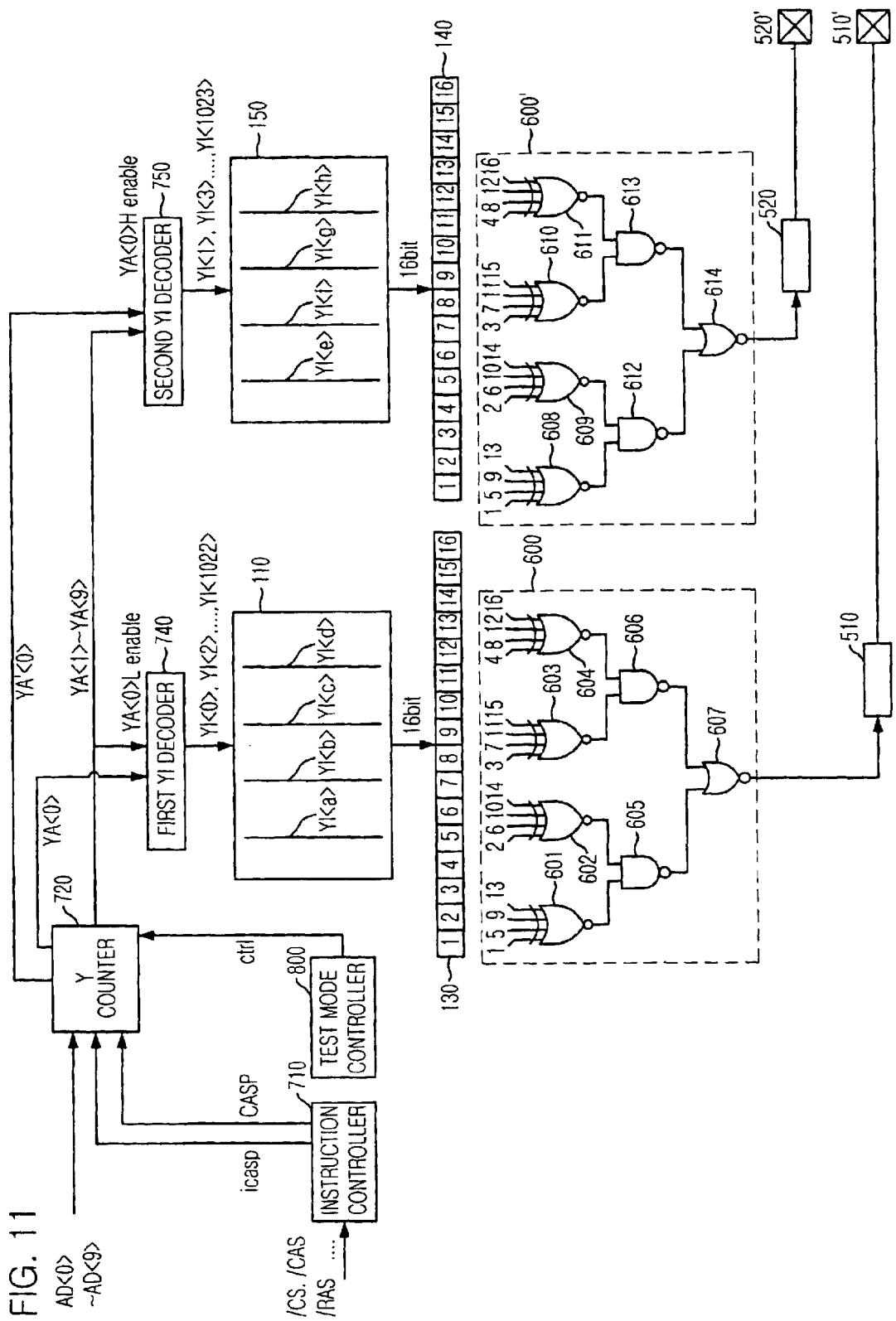
FIG. 11 is a block diagram showing a test block for testing memory device in accordance with another preferred embodiment of the present invention.

FIG. 11 is a diagram showing a test block for testing memory device in accordance with another embodiment of the present invention.

As shown, the control signal ctrl outputted from a test mode control unit is inputted to a Y counter 720. The Y counter 720 receives the control signal ctrl in the test mode and outputs the block select signal YA<0> to first and second YI decoding units 740 and 750. Herein, the block select signal YA<0> is inputted to the first YI decoding unit 740 is in logical low. The block select signal YA<0> is is inputted to the second YI decoding unit 750 in logical high. Thus, the first and second YI decoding units 740 and 750 are always enabled regardless of the block select signal YA<0>.

Four YI lines are simultaneously selected by enabling the first and second YI decoding units 740 and 750 in the test mode so that 16-bit test data are outputted from the first and second unit block 110 and 150. The outputted test data is combined by the first and second combing circuits 600 and 600'. Each of combined one-bit test data is outputted to an external circuit after passing through each of the first and second output buffers 510 and 520 and each of the first and second output pads 510' and 520'.

FIG. 12 is a schematic circuit diagram showing a Y counter described in FIG. 11.

As shown, in normal operation of the memory device in accordance with the preferred embodiment of the present invention, the Y counter receives the address signal AD<0> and outputs the block select signal YA<0>. If the address signal AD<0> is in logical low, the first YI decoding unit 740 is enabled. If the address signal AD<0> is in logical high, the second YI decoding unit 750 is enabled.

In the test mode, regardless of the address signal AD<0>, the block select signal YA<0> outputted to the first YI decoding unit 740 by the test mode control unit 800 is always in logical low. Also, a counted address selecting signal YA<1> outputted to the second YI decoding unit 750 is always in logical high.

Thus, in the test mode, the first and the second YI decoding units 740 and 750 are enabled regardless of the address signal AD<0> and individually output 16-bit test data. In FIG. 12, though there is described a part of the Y counter related to the address signal AD<0>, the part of the Y counter is applied to that in response to other address signals AD<1> to AD<9>.

FIG. 13 is a schematic circuit diagram showing a Y count described in FIG. 11.

The Y counter is similar to the Y counter shown in FIG. 12 but further includes MOS transistors 743 and 743' for receiving the control signal ctrl.

Therefore, according to the present invention, the memory device can reduce time for testing total cells in the memory device by using smaller additional circuit and adjusting a few circuits.

While the present invention has been described with respect to the particular embodiments, it will be apparent to those skilled in the art that various changes and modifications may be made without departing from the spirit and scope of the invention as defined in the following claims.

What is claimed is:

1. A memory device which includes at least one bank having first and second unit blocks, each containing a plurality of cell arrays and first and second decoding units for decoding an inputted column address and outputting column selecting signals of the first and second unit blocks, comprising:

a column address transmitting unit for simultaneously enabling the first and second decoding unit, regardless of a bit select block signal, which selects the first or second unit blocks, of the inputted column address during a test mode;

a first combining circuit for combining test data outputted by the column selecting signal of the first unit blocks and detecting an error of the test data in the test mode;

a second combining circuit for combining test data outputted by the column selecting signal of the second unit blocks and detecting an error of the test data in the test mode; and a first and a second output pads for individually outputting each of outputted signals from the first and second combining circuits.

2. The memory device as recited in claim 1, wherein the column address transmitting unit selectively enables the first or the second decoding unit in response to the bit select block signal during a normal mode.

3. The memory device as recited in claim 2, wherein each of the first and second combining circuits includes:

first to forth exclusive NOR gates for receiving data of each group having a same value among the whole test data;

first and second NAND gates for individually receiving each two output signals of the four NOR gates; and a NOR gate for receiving output signals of the first and second NAND gate.

4. A memory device which includes at least one bank having first and second unit blocks, each having a plurality of cell arrays, a counting unit for counting an inputted column address by a burst length and thereon outputting, and first and second decoding unit for decoding an inputted column address and outputting column selecting signals of the first and second unit blocks, comprising:

a test mode controller for simultaneously enabling the first and second decoding unit, regardless of an outputted column address from the counting unit during a test mode;

a first combining circuit for combining test data outputted by the column selecting signal of the first unit blocks and detecting an error of the test data in the test mode;

a second combining circuit for combining test data outputted by the column selecting signal of the second unit blocks and detecting an error of the test data in the test mode; and first and second output pads for individually outputting each of outputted signals from the first and second combining circuits.

\* \* \* \* \*

UNITED STATES PATENT AND TRADEMARK OFFICE
CERTIFICATE OF CORRECTION

PATENT NO.     : 6,836,445 B2
DATED          : December 28, 2004
INVENTOR(S)    : Byung-Jae Lee It is certified that error appears in the above-identified patent and that said Letters Patent is hereby corrected as shown below:

<u>Column 10,</u>
Line 61, after "first to" please delete "forth" and insert -- fourth -- in its place.

Signed and Sealed this

Seventh Day of June, 2005

JON W. DUDAS
*Director of the United States Patent and Trademark Office*